United States Patent
Choi et al.

(10) Patent No.: US 12,015,418 B2
(45) Date of Patent: Jun. 18, 2024

(54) NOISE FILTERING CIRCUIT, D/A CONVERTER, AND ELECTRONIC DEVICE INCLUDING THE SAME

(71) Applicant: SAMSUNG ELECTRONICS CO., LTD., Suwon-si (KR)

(72) Inventors: Moo Yeol Choi, Seongnam-si (KR); Young Hyun Yoon, Gwangmyeong-si (KR); Hyun Sun Shim, Seongnam-si (KR); Myung-Jin Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 42 days.

(21) Appl. No.: 17/815,678

(22) Filed: Jul. 28, 2022

(65) Prior Publication Data

US 2023/0188147 A1   Jun. 15, 2023

(30) Foreign Application Priority Data

Dec. 10, 2021 (KR) .................. 10-2021-0176707

(51) Int. Cl.
  *H03M 1/00* (2006.01)
  *H03M 1/08* (2006.01)

(52) U.S. Cl.
  CPC .................... *H03M 1/08* (2013.01)

(58) Field of Classification Search
  CPC . H03F 3/245; H03F 1/301; H03F 1/26; H03F 1/0205; H03F 1/0272; H03F 2200/261; H03F 2200/165; H03F 1/3205; H03F 1/0211; H03F 3/72; H03F 1/0216; H03F 1/0288; H03F 1/223; H03F 1/3211; H03F 1/52; H03F 2200/129; H03F 2200/135; H03F 2200/27; H03F 2200/375; H03F 2200/411; H03F 2200/45; H03F 2200/459; H03F 2200/462;

(Continued)

(56) References Cited

U.S. PATENT DOCUMENTS 6,515,542 B1   2/2003  Wang et al.
6,885,244 B2 *  4/2005  Shor ................. H03F 3/211
                                              330/253

(Continued)

FOREIGN PATENT DOCUMENTS

JP   2003218695   7/2003
JP   2007143196   6/2007

*Primary Examiner* — Linh V Nguyen
(74) *Attorney, Agent, or Firm* — F. CHAU & ASSOCIATES, LLC

(57) ABSTRACT

A noise filtering circuit, a digital to analog converter and an electronic device are provided. The noise filtering circuit comprises a first amplifier configured to receive a bias voltage at a first input terminal, receive a bias output voltage at a second input terminal though a feedback path, and compensate for a difference between the bias voltage and the bias output voltage; a first transistor connected to an output of the first amplifier and having a gate to which an off-voltage is applied; a first capacitor connected to the first transistor; a second capacitor connected to the output of the first amplifier; a second transistor connected to the second capacitor and having a gate to which an off-voltage is applied, and a second amplifier having an input terminal connected to the first capacitor and a second input terminal connected to the second transistor.

20 Claims, 8 Drawing Sheets

(58) Field of Classification Search
CPC ......... H03F 2200/471; H03F 2200/498; H03F 2203/45116; H03F 3/04; H03F 3/45076; H03M 1/00; H03M 1/06; H03M 1/12; H03M 3/30; H03M 1/0607; H03M 1/10; H03M 1/46; H03M 3/356; H03M 3/386; H03M 3/424; H03M 3/444; H03M 3/454; H03M 3/464; H03M 1/0626; H03M 1/0863; H03M 1/124; H03M 1/164; H03M 1/468; H03M 1/745; H03M 3/322; H03M 3/368; H03M 3/422; H03M 3/50; H03M 1/66; H03M 1/1023; H03M 1/0682; H03M 1/1004; H03M 1/365; H03M 1/1014; H03M 1/50; H03M 1/206; H03M 1/363; H03M 1/56; H03M 3/414; H03M 3/43; H03M 3/46; H03M 3/466; H03M 3/486; H03M 1/485; H03M 3/04; H04R 25/505
USPC .......................................... 341/134–136, 144
See application file for complete search history.

(56) References Cited

U.S. PATENT DOCUMENTS

| | | | |
|---|---|---|---|
| 7,622,988 | B2 | 11/2009 | Denison et al. |
| 7,847,717 | B2 | 12/2010 | Mishra et al. |
| 8,531,237 | B2* | 9/2013 | Aisu ...................... G05F 1/575 |
| | | | 327/558 |
| 9,094,032 | B2 | 7/2015 | Dugalleix et al. |
| 9,209,690 | B2* | 12/2015 | Srinivasan .............. G05F 1/468 |
| 9,552,004 | B1* | 1/2017 | Dixit ...................... G05F 1/575 |
| 9,588,541 | B1* | 3/2017 | Ho ........................ G05F 1/573 |
| 9,831,892 | B1* | 11/2017 | Tsai ...................... H03M 3/368 |
| 10,348,250 | B2 | 7/2019 | Dempsey |
| 2005/0127885 | A1* | 6/2005 | Jung ........................ H03F 1/38 |
| | | | 323/282 |
| 2020/0106388 | A1* | 4/2020 | Mortazavi ............ H03F 1/0211 |
| 2021/0336586 | A1* | 10/2021 | Lee ........................ G05F 3/262 |
| 2022/0206519 | A1* | 6/2022 | Zhong ..................... G05F 1/461 |
| 2023/0170859 | A1* | 6/2023 | Singhal .................. H03F 3/195 |

\* cited by examiner

NOISE FILTERING CIRCUIT, D/A CONVERTER, AND ELECTRONIC DEVICE INCLUDING THE SAME

This application claims priority from Korean Patent Application No. 10-2021-0176707 filed on Dec. 10, 2021 in the Korean Intellectual Property Office, the disclosure of which is incorporated herein by reference in its entirety.

FIELD

The present disclosure relates to a noise filtering circuit, a digital/analog (D/A) converter, and an electronic device including the same.

DISCUSSION OF RELATED ART

An electronic device may include a bias voltage generating circuit that generates a bias voltage for driving thereof. The bias voltage generated by the bias voltage generating circuit may include noise of various types or originating from various sources, depending on driving environments of the electronic device.

In the case of an electronic device that requires high resolution even when the bias voltage is noisy, the noise included in the bias voltage may significantly deteriorate the overall performance of the electronic device. Accordingly, noise reduction circuitry may typically be added to meet requisite performance requirements. As performance requirements become more stringent, e.g., with ever higher resolution devices, there is a need to improve the metrics of the noise reduction circuitry.

SUMMARY

Aspects of the present disclosure provide a noise filtering circuit having improved noise removal performance.

Aspects of the present disclosure also provide a digital to analog (D/A) converter that performs a digital-to-analog conversion with a bias voltage from which noise is removed.

Aspects of the present disclosure also provide an electronic device driven by a bias voltage from which noise is removed.

In an aspect, a noise filtering circuit includes: a first amplifier configured to receive a bias voltage at a first input terminal, receive a bias output voltage through a feedback path at a second input terminal, and compensate for a difference between the bias voltage and the bias output voltage; a first transistor connected to an output of the first amplifier and having a gate terminal to which an off-voltage is applied; a first capacitor connected to the first transistor; a second capacitor connected to the output of the first amplifier; a second transistor connected to the second capacitor and having a gate terminal to which an off-voltage is applied; and a second amplifier having a first input terminal connected to the first capacitor and a second input terminal connected to the second transistor.

In another aspect, an electronic device includes: a bias voltage generating circuit configured to generate a bias voltage; a noise filtering circuit configured to filter noise of the bias voltage to generate a bias output voltage; and an output circuit configured to perform a predetermined function, using the bias output voltage. The noise filtering circuit includes a first amplifier which compensates for a difference between the bias voltage and the bias output voltage, a first transistor connected to an output of the first amplifier and having a gate terminal to which an off-voltage is applied, a first capacitor connected to the first transistor, a second capacitor connected to the output of the first amplifier, a second transistor connected to the second capacitor and having a gate terminal to which the off-voltage is applied, and a second amplifier that receives the bias output voltage and provides an output to the second transistor on the basis of the bias output voltage.

Some examples of the electronic device include a D/A converter, a low dropout (LDO) regulator, and a memory device.

According to another aspect, a noise filtering circuit includes a first amplifier configured to receive a bias voltage at a first input terminal, receive a bias output voltage, appearing at an output node of the noise filtering circuit, at a second input terminal through a feedback path, and compensate for a difference between the bias voltage and the bias output voltage. A first transistor has a first end connected to an output of the first amplifier, a gate to which a voltage is applied sufficient to cause the first transistor to operate in a resistor mode, and a second end connected to the output node. A first capacitor is connected between the output node and a circuit ground. A second transistor has a gate terminal to which a voltage is applied sufficient to operate the second transistor in a resistor mode. A second capacitor is connected between the output of the first amplifier and a first end of the second transistor. A second amplifier has an input terminal connected to the output node and an output terminal connected to a second end of the second transistor. The first capacitor and a resistance provided by the first transistor form a low pass circuit to filter noise. The input terminal of the second amplifier may be a first input terminal, and the second amplifier may have a second input terminal connected to its output terminal such that the second amplifier operates as a unity gain amplifier. Each of the first and second transistors may be a PMOS transistor, where the first end of the first transistor may be a source terminal, and the second end of the first transistor may be a drain terminal, and the first and second ends of the second transistor may be drain and source terminals, respectively.

BRIEF DESCRIPTION OF THE DRAWINGS

The above and other aspects and features of the present disclosure will become more apparent by describing in detail exemplary embodiments thereof referring to the attached drawings, in which.

DETAILED DESCRIPTION OF EMBODIMENTS

Hereinafter, embodiments of the present inventive concept will be described referring to the accompanying drawings.

Herein, when a first circuit component ("component"), e.g., a transistor, a capacitor, an amplifier, etc.) is said to be "connected to" a second circuit component, the first and second components may be directly or indirectly connected. When directly connected, the first and second components are connected without any intervening component ((e.g., each is connected to a common circuit node in a schematic). If the context refers to a drawing showing a direct connection example, it is understood that the addition of an intervening component may be possible in an alternative embodiment to that illustrated.

Figure 1:
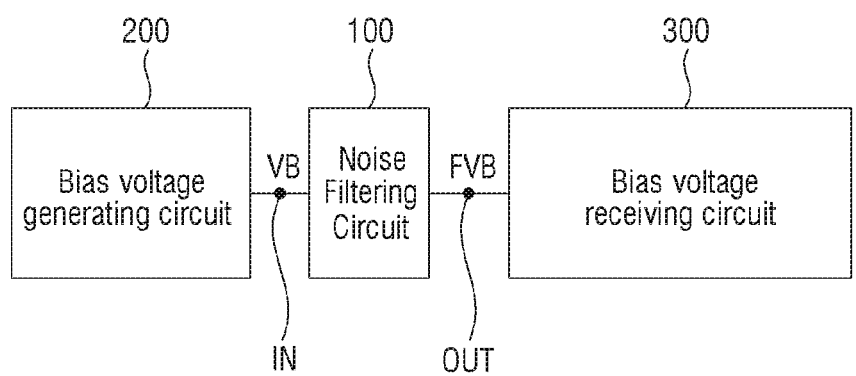
FIG. 1 is a block diagram schematically showing an electronic device according to some embodiments.

FIG. 1 is a block diagram schematically showing an electronic device according to some embodiments. The electronic device 1 includes a noise filtering circuit 100, a bias voltage generating circuit 200, and a bias voltage receiving circuit 300.

An input terminal IN of the noise filtering circuit 100 may be connected to the bias voltage generating circuit 200. An output terminal OUT of the noise filtering circuit 100 may be connected to the bias voltage receiving circuit 300.

The bias voltage generating circuit 200 may generate a bias voltage VB required for the operation of the bias voltage receiving circuit 300. The noise filtering circuit 100 may filter out (interchangeably, "filter") the noise of the bias voltage VB generated by the bias voltage generating circuit 200 to generate a bias output voltage FBV. Further, the noise filtering circuit 100 may transfer the bias output voltage FBV to the bias voltage receiving circuit 300.

In the case of the electronic device that requires a high resolution, the noise included in the bias voltage may significantly degrade the overall performance of the electronic device. Therefore, the bias voltage needs to be filtered against noise, and the noise filtering circuit 100 performs such a noise filtering operation.

Figure 2:
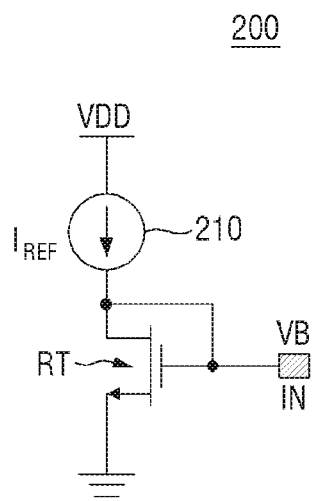
FIG. 2 is a circuit diagram schematically showing an example bias voltage generating circuit of FIG. 1.

FIG. 2 is a circuit diagram schematically showing an example of the bias voltage generating circuit of FIG. 1. Here, the bias voltage generating circuit 200 may include a reference transistor RT. A reference current flows within the bias voltage generating circuit 200 by a reference current source 210, and the bias voltage VB may be generated at the input terminal IN by the reference transistor RT accordingly. The reference transistor RT may generate the bias voltage VB such that the reference current flows through the bias voltage generating circuit 200.

Figure 3:
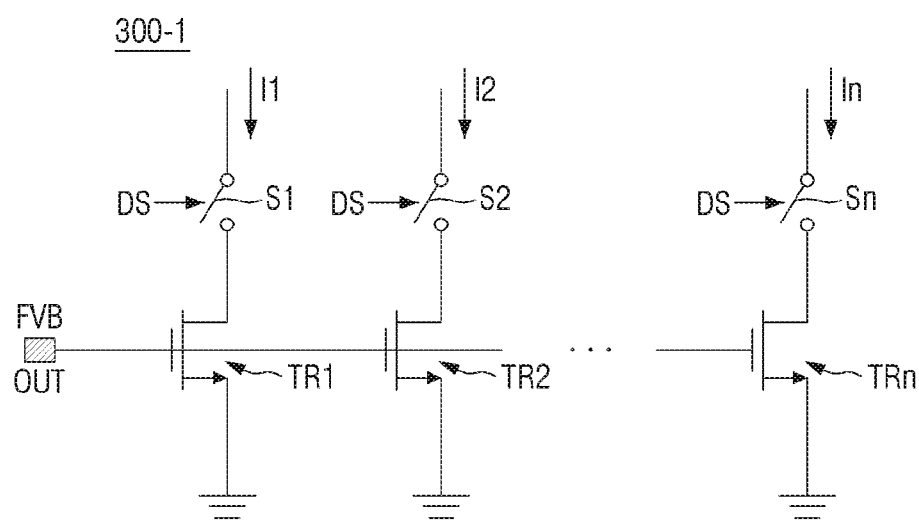
FIG. 3 is a circuit diagram schematically showing an example bias voltage receiving circuit of FIG. 1.

FIG. 3 is a circuit diagram schematically showing a bias voltage receiving circuit 300-1, which is an example of the receiving circuit 300 of FIG. 1. The bias voltage receiving circuit 300-1 may include a plurality of transistors TR1 to TRn (n is natural number of 2 or more), and a plurality of switches S1 to Sn.

Gate terminals of the TR1 to TRn are connected to the output terminal ("output node") OUT to receive the bias output voltage FBV. Here, the bias output voltage FBV is a voltage at which the bias voltage VB is filtered by the noise filtering circuit 100 and noise is removed from the bias voltage VB.

The transistors TR1 to TRn may each generate output currents I1 to In due to the bias output voltage FBV provided to the gate terminal. In other words, the bias output voltage FBV is a voltage required for each of the plurality of transistors TR1 to TRn to generate output currents I1 to In.

The output currents I1 to In thus generated may be used to generate an analog signal.

Each of transistors TR1 to TRn may be connected to each of a plurality of switches S1 to Sn. A digital signal DS may be provided to the switches S1 to Sn. Turning-on and turning-off of each of the switches S1 to Sn may be determined depending on the digital signal DS.

Therefore, the sum of the output currents I1 to In that are output from transistors TR1 to TRn may change to correspond to the digital signal DS. Thus, analog signals that differ from each other may be generated to correspond to the digital signal DS. In this case, the bias voltage receiving circuit 300-1 may serve as a signal generating circuit.

Figure 4:
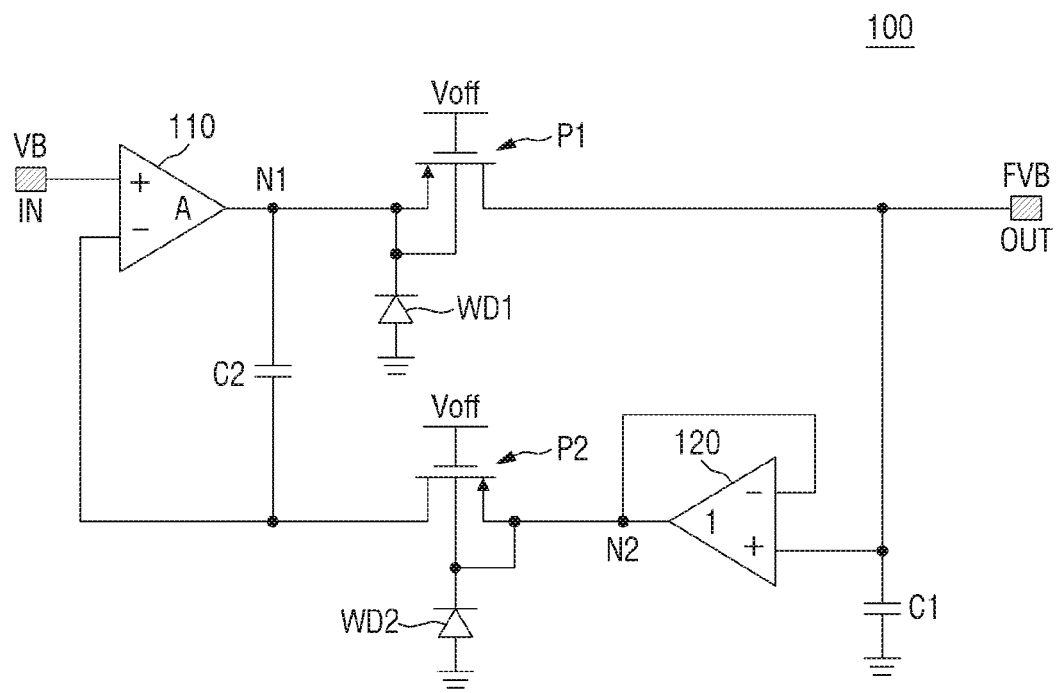
FIG. 4 is a circuit diagram schematically showing an example noise filtering circuit of FIG. 1.
Figure 5:
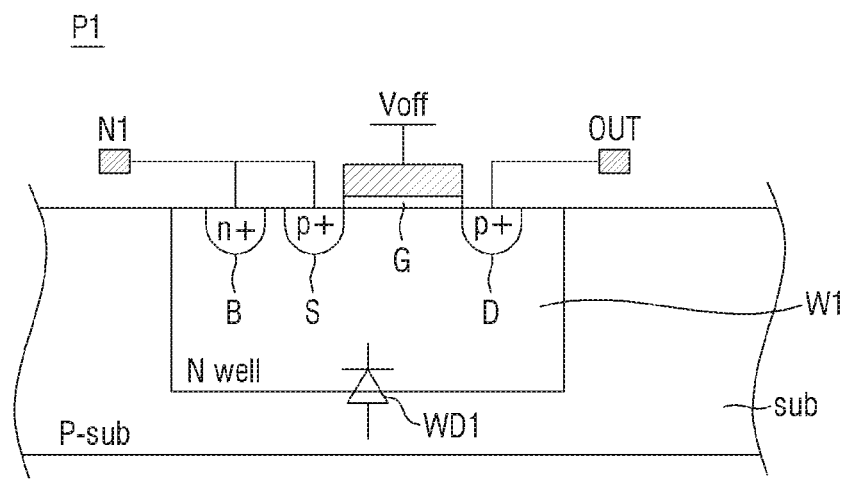
FIG. 5 is a diagram for explaining a well diode of a transistor shown in FIG. 4.

FIG. 4 is a circuit diagram schematically showing an example of the noise filtering circuit of FIG. 1. FIG. 5 is a diagram for explaining a well diode of the transistor shown in FIG. 4.

Referring to FIG. 4, the noise filtering circuit 100 may include a first amplifier 110, a second amplifier 120, a first transistor P1, a second transistor P2, a first capacitor C1, and a second capacitor C2. The first and second amplifiers may each be operational amplifiers (op-amps).

The first amplifier 110 may receive the bias voltage VB input to the first input terminal (+) through the input terminal IN, and may receive the bias output voltage FVB output to the second input terminal (−) through the output terminal OUT in a feedback path.

The first amplifier 110 receives feed-back of the bias output voltage FVB, and may adjust the output supplied to a node N1 so that the bias output voltage FVB becomes equal to the bias voltage VB. A voltage gain of the first amplifier 110 may be "A" (A is a real number greater than 1).

For example, when the bias output voltage FVB is smaller than the bias voltage VB, the first amplifier 110 may increase the output supplied to the node N1 and adjust the bias output voltage FVB to be equal to the bias voltage VB.

For example, when a gate leakage current is generated by a transistor (for example, TR1 to TRn of FIG. 3) included in the bias voltage receiving circuit connected to the output terminal OUT, the bias output voltage FVB may be pulled lower than the bias voltage VB.

In this case, the first amplifier 110 may increase the output provided to the node N1 to adjust the bias output voltage FVB to be equal to the bias voltage VB. Therefore, the bias voltage receiving circuit (300 of FIG. 1) may receive a stable voltage at the same level as the bias voltage VB.

Since the noise filtering circuit 100 is made up of a feedback circuit including the first amplifier 110, distortion of the bias voltage due to the leakage current generated in the output terminal OUT and the bias voltage receiving circuit (300 of FIG. 1) may be compensated for.

The first transistor P1 operating in a resistor mode, and the first capacitor C1 may together operate as an RC low pass filter to filter the noise included in the bias voltage VB. Therefore, the bias output voltage FVB may be a voltage in which noise is removed from the bias voltage VB. Note that even though the second transistor P2 also operates in a resistor mode, it does not contribute, or only negligibly contributes, to the resistance R of the RC filter, due to the presence of the second amplifier 120.

If the noise filtering circuit 100 were not present, the bias output voltage FVB received by the bias voltage receiving circuit (300 of FIG. 1) may include the noise of the bias voltage VB itself and the noise that occurs in the process of transferring the bias voltage VB. The noise filtering circuit 100 may remove noise from the bias voltage VB by low pass filtering out the high frequency component of the bias voltage VB and transferring the filtered bias voltage to the bias voltage receiving circuit (300 of FIG. 1).

An RC filter may be considered as a method for filtering the high frequency component of the bias voltage VB, and in this embodiment, the high frequency component of the bias voltage VB may be filtered by causing the first transistor P1 to serve as a resistor of the RC filter.

One end (for example, a source terminal) of the first transistor P1 is connected to the node N1 to which the output of the first amplifier 110 is transferred. The other end (for example, a drain terminal) of the first transistor P1 is connected to the output terminal OUT to which the bias output voltage FBV is output. An off-voltage Voff may be provided to the gate terminal of the first transistor P1.

The first transistor P1 may be a p-type metal-oxide-semiconductor field effect transistor (PMOS transistor), as illustrated in FIG. 5, but other embodiments utilizing transistors of a different type (e.g., NMOS) are also possible.

Here, the off-voltage Voff may be a voltage that is equal to or lower than an absolute threshold voltage of the first transistor P1 that turns off the first transistor P1. Therefore, the first transistor P1 may operate in a turn-off or sub-threshold status and may perform the same function as a resistor having a high resistance value.

To compensate for distortion of the bias voltage due to the leakage current generated in the output terminal OUT and the bias voltage receiving circuit (300 of FIG. 1), while efficiently filtering noise of the bias voltage VB in a region higher than a constant bandwidth, an RC filter including a resistor having a high resistance value and a capacitor having a high capacitance may be formed to implement the noise filtering.

It is noteworthy that when a lumped element resistor having a high resistance value is employed in a circuit, the resistor occupies a large area, which limits the miniaturization of the electronic device. The transistor P1, on the other hand, when biased to function as a resistor with the same resistance, occupies a smaller area. Thus, by applying a low pass RC filter including the first transistor P1 and the first capacitor C1, it is possible to efficiently filter the bias voltage VB, while reducing the size of the electronic device.

For example, the voltage gain of the first amplifier 110 may be a high gain to effectively compensate for a difference between the bias output voltage FVB and the bias voltage VB. In this case, due to the high voltage gain of the first amplifier 110, the filtering bandwidth of the RC filter including the first transistor P1 and the first capacitor C1 may be wider than that of a general RC filter.

The second transistor P2 and the second capacitor C2 may thus serve to reduce the increased bandwidth due to the high voltage gain of the first amplifier 110.

One end (for example, a source terminal) of the second transistor P2 is connected to the output terminal OUT. The other end (for example, a drain terminal) of the second transistor P2 is connected to the second input terminal (−) of the first amplifier 110. An off-voltage Voff may be provided to the gate terminal of the second transistor P2.

The second transistor P2 may be a PMOS transistor. In other embodiments, the second transistor is an NMOS transistor or other type of transistor. If an NMOS transistor is substituted, the doping region types shown in FIG. 5 may be flipped (e.g., p+ regions may be replaced with n+ regions, etc.).

Similarly, here, the off-voltage Voff may be a voltage that is equal to or less than the threshold voltage absolute value of the second transistor P2 that turns off the second transistor P2. Therefore, the second transistor P2 may operate in a turn-off or sub-threshold status to perform the same function as a resistor having a high resistance value. Thus, the second transistor P2 may perform the same function as a resistor having a high resistance value, while occupying a smaller area, as discussed above for P1. The second capacitor C2 may be, for example, a pole compensating capacitor.

The first transistor P1 has a parasitic well diode WD1 due to its structure (e.g., formed by a p-n junction between a p type substrate and an n-type well, discussed below), and the second transistor P2 similarly has a well diode WD2 due to its structure.

Referring to FIG. 5, the first transistor P1 embodied as a PMOS may include a well W1 formed inside the substrate sub, a base region B, a source region S and a drain region D formed inside the well W1, and a gate electrode G. The base, source and drain regions, each formed within a doped well and extending from a top surface of the transistor where connections to other circuit components may be made, may sometimes be called "tub" regions.

With the first transistor P1 exemplified as a PMOS, the substrate sub may be "p" doped (the conductivity type is p-type); the well W1 may be "n" doped (the conductivity type is n-type). The conductive type of the base region B may be n-type e.g., n+ doped), and the conductive types of the source region S and the drain region D may each be p-type (e.g., p+ doped).

The base region B and the source region S may be connected to the node N1 to receive the output of the first amplifier (110 of FIG. 4), and the drain region D may be connected to the output terminal (OUT of FIG. 4) at which the bias output voltage FBV is output.

The off-voltage Voff may be provided to the gate electrode G.

A well diode WD1 may be formed between the p-type substrate sub of the first transistor P1 and the n-type well W1. A well diode WD2 may also be formed between the p-type substrate and the n-type well in the second transistor P2 having the same structure.

In such well diodes WD1 and WD2, a leakage current may occur, which may affect the operations of the transistors P1 and P2.

Referring to FIG. 4, when a leakage current due to the well diode WD1 of the first transistor P1 occurs, the first amplifier 110 may compensate for the leakage current. Further, when a leakage current due to the well diode WD2 occurs, the second amplifier 120 may compensate for the leakage current.

The second amplifier 120 may have a voltage gain of 1 to compensate for the leakage current due to the well diode WD2. In other words, the second amplifier 120 may serve as a buffer for compensating for the leakage current due to the well diode WD2. The second amplifier 120 may be a unity feedback amplifier.

A first input terminal (+) of the second amplifier 120 may be connected to an output terminal OUT to receive the bias output voltage FVB, and a second input terminal (−) thereof may be connected to the node N2 which is the output of the second amplifier 120. If a leakage current due to the well diode WD2 occurs, the voltage level of the node N2 may be lowered (pulled down), and the second amplifier 120 may adjust the output supplied to the node N2 so that the voltage level of the node N2 becomes equal to the bias output voltage FVB.

Advantageously, at frequencies above cut-off, the second amplifier 120 may open the path from the output of the first amplifier 110 (through the capacitor C2 and the second transistor P2) to the first capacitor C1. This results in the cut-off frequency of the noise filtering circuit 100 being reduced, whereby noise that otherwise may appear in the output voltage FVB is reduced or eliminated.

Figure 6:
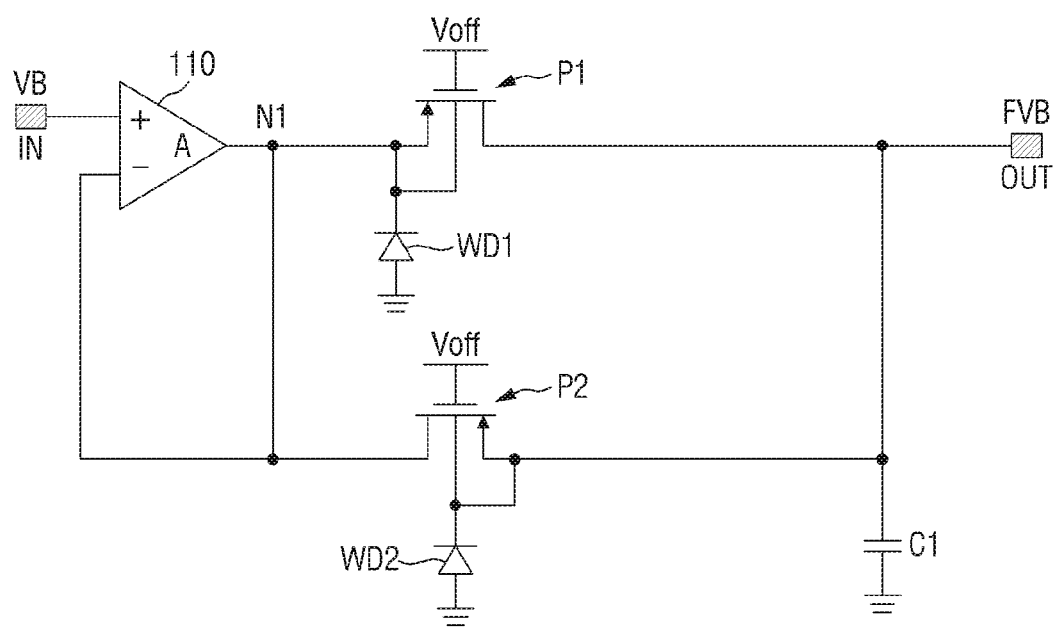
FIG. 6 is schematic circuit diagram that substitutes conceptual elements for components of a related art noise filtering circuit to explain its operation.

FIG. 6 is schematic circuit diagram that substitutes conceptual elements for components of a related art noise filtering circuit to explain its operation. To facilitate an understanding of a difference between the noise filter 100 of FIG. 4, it is assumed that the noise filter 100 of FIG. 4 has a low pass filtering cut-off frequency of "fc1".

In the related art circuit of FIG. 6, the second amplifier 120 is not present. At the high frequency band where noise exists, the impedance of the second capacitor C2 may become very low. In such a situation, as shown in FIG. 6, since the second amplifier 120 does not exist in the related art noise filter, since the first transistor P1 and the second transistor P2 operate in a resistive mode and are connected in parallel, on the path in which the output of the first amplifier 110 is transferred to the output terminal OUT, and a low pass filtering cut-off frequency "fc2" of the noise filtering circuit 100 is higher than fc1 of the noise filter 100 of FIG. 4 herein. Thus, the noise removal ability is inferior to that of the noise filter 100 of FIG. 4, because noise at frequencies between fc1 and fc2 is not reduced as much, or at all.

Figure 7:
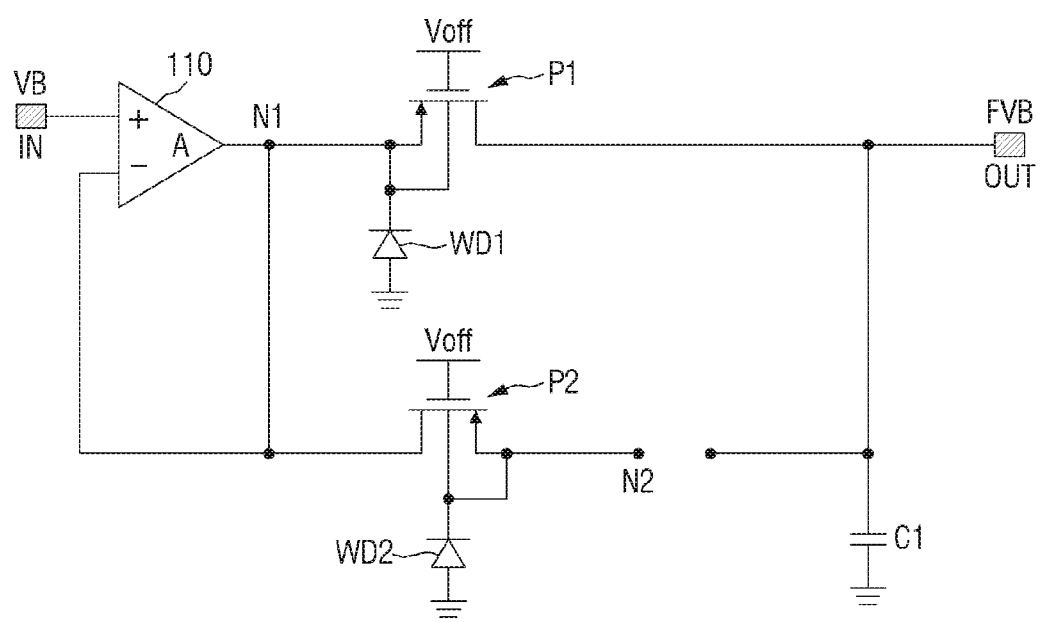
FIG. 7 is schematic circuit diagram that substitutes conceptual elements for components of the noise filtering circuit of FIG. 4 to explain its operation.

FIG. 7 is schematic circuit diagram that substitutes conceptual elements for components of the noise filtering circuit of FIG. 4 to explain its operation. When the second amplifier 120 is present between the second transistor P2 and the output terminal OUT, as illustrated in FIG. 7, the second amplifier 120 serves to disconnect the path between the second transistor P2 and the output terminal OUT at the high frequency band where noise exists. Therefore, the first transistor P1 and the second transistor P2 are not connected in parallel on the path in which the output of the first amplifier 110 is transferred to the output terminal OUT. As a result, the cut-off frequency of the noise filtering circuit 100, fc1, is lower than fc2 of the related art noise filter just discussed, and the noise removal ability may be improved.

The cut-off frequency is reduced with the noise filter 100 of FIG. 4 compared to the related art because without the amplifier 120, a total effective resistance $R_T$ of an RC low pass circuit formed using the transistors P1 and P2 and the capacitor C1 may be a resistance formed by the parallel connection of transistors P1 and P2. Here, $R_T$ may equal R1*R2/(R1+R2), where R1 and R2 are the effective resistances of transistors P1 and P2. When the amplifier 120 is present, it may appear as an open circuit in the path from the amplifier 110 through the capacitor C2 and the transistor P2 to the output terminal OUT. The total resistance $R_T$ may be a higher value, R1, which is just the resistance of transistor P1. This results in a lower cut-off frequency fc, since fc may equal $1/(2\pi R_T C,)$ where C is the capacitance of capacitor C1.

Figure 8:
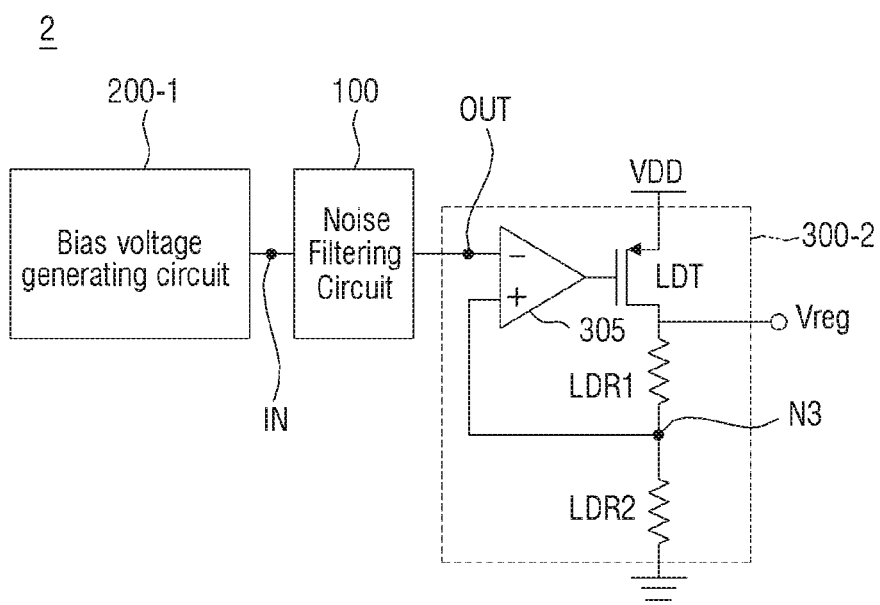
FIG. 8 is a diagram schematically showing an electronic device according to some other embodiments.

FIG. 8 is a block diagram schematically showing an electronic device, 2, according to another embodiment. The electronic device 2 may be an LDO regulator (Low Drop Out regulator).

The electronic device 2 includes a noise filtering circuit 100, a bias voltage generating circuit 200-1, and a bias voltage receiving circuit 300-2, which is another example of the bias voltage receiving circuit 300 of FIG. 1).

The noise filtering circuit 100 may be configured and operate as described above in connection with FIGS. 4-5 and 7. An input terminal IN of the noise filtering circuit 100 may be connected to the bias voltage generating circuit 200-1. An output terminal OUT of the noise filtering circuit 100 may be connected to the bias voltage receiving circuit 300-2.

The bias voltage generating circuit 200-1 may generate bias voltage to be applied for the operation of the bias voltage receiving circuit 300-2. The noise filtering circuit 100 may filter the noise of the bias voltage generated by the bias voltage generating circuit 200-1 and transfer it to the bias voltage receiving circuit 300-2.

The bias voltage receiving circuit 300-2 may receive a bias voltage through the output terminal OUT, and generate a regulated voltage Vreg.

The bias voltage receiving circuit 300-2 may include a regulating amplifier 305, a regulating transistor LDT, a first regulating resistor LDR1, and a second regulating resistor LDR2.

The regulating amplifier 305 may control the regulating transistor LDT on the basis of a difference between the voltage of the node N3 (e.g., applied to a (+) input terminal of amplifier 305 in a feedback loop) and the bias voltage provided from the noise filtering circuit 100 (e.g., applied to a (−) input terminal of amplifier 305.

A source of the regulating transistor LDT may be connected to a power supply voltage VDD. A drain of the regulating transistor LDT may be connected to one end of the first regulating resistor LDR1.

The regulating voltage Vreg may be output through the drain of the regulating transistor LDT.

The other end of the first regulating resistor LDR1 may be connected to a node N3, which may be connected to a (+) input terminal of the regulating amplifier 305 in a feedback loop. One end of the second regulating resistor LDR2 may be grounded (connected to a circuit ground), and the other end of the second regulating resistor LDR2 may be connected to the node N3.

The bias voltage receiving circuit 300-2 may have a target regulating voltage Vreg which may be based on fixed resistance values of the regulating resistors LDR1 and LDR2. In some embodiments, the regulating resistors LDR1 and LDR are variable resistors having resistance values controlled by a control signal. In this case, the circuit 300-2 may adjust the target regulating voltage Vreg by adjusting the variable resistors LDR1 and LDR2.

Figure 9:
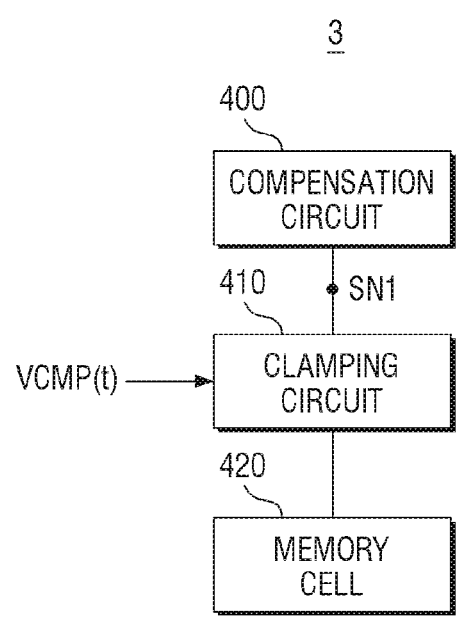
FIGS. 9 and 10 are diagrams schematically showing an electronic device according to some other embodiments.
Figure 10:
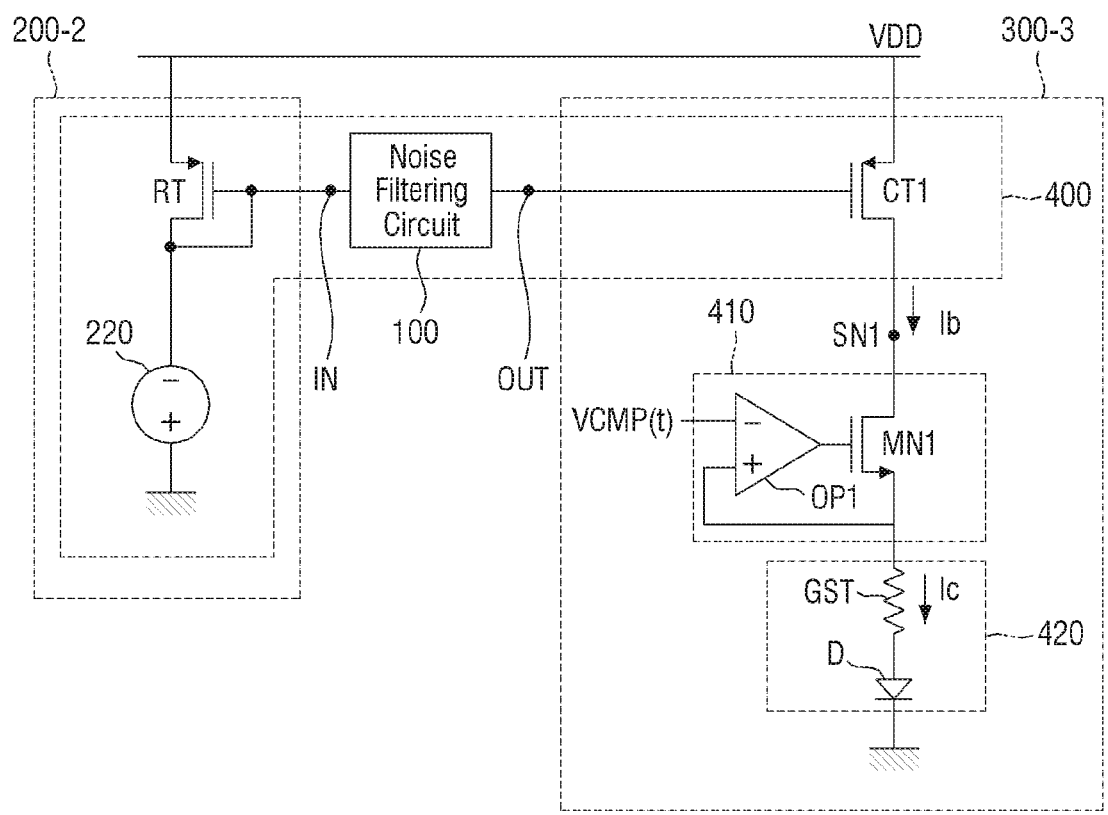

FIGS. 9 and 10 are diagrams schematically showing an electronic device, 3, according to some other embodiments. In this example, the electronic device 3 may be a memory device.

Referring to FIGS. 9 and 10, the electronic device 3 includes a noise filtering circuit 100, a bias voltage generating circuit 200-2, and a bias voltage receiving circuit 300-3.

The noise filtering circuit 100 may be configured and operate as described above in connection with FIGS. 4-5 and 7. The input terminal IN of the noise filtering circuit 100 may be connected to the bias voltage generating circuit 200-2. The output terminal OUT of the noise filtering circuit 100 may be connected to the bias voltage receiving circuit 300-3.

The noise filtering circuit 100, the bias voltage generating circuit 200-2, and a part of the bias voltage receiving circuit 300-3 may form a compensation circuit 400. Another part of the bias voltage receiving circuit 300-3 may form a clamping circuit 410. Still other part of the bias voltage receiving circuit 300-3 may form a memory cell 420.

The memory cell 420 shown in FIG. 10 illustrates a resistive memory cell selected to read among a plurality of resistive memory cells inside the memory cell array. Here, when the resistive memory cell 420 is a phase-change random access memory (PRAM), the resistive memory cell 420 may include a variable resistance element GST including a phase change substance, and an access element D that controls the current flowing through a variable resistance element GST. Here, the access element D may be a diode or a transistor connected in series with the variable resistance element GST. The phase change substance may use various types of substances, such as GaSb, InSb, InSe, Sb2Te3 and GeTe, which are combinations of two elements; GeSbTe, GaSeTe, InSbTe, SnSb2Te4 and InSbGe, which are combinations of three elements; or AgInSbTe, (GeSn)SbTe, GeSb(SeTe), and Te81Ge15Sb2S2, which are combinations of four elements. Among these, GeSbTe including germanium (Ge), antimony (Sb) and tellurium (Te) may be typically used.

On the other hand, when the resistive memory cell 420 is a resistive RAM (RRAM), the variable resistance element may include, for example, NiO or perovskite. Perovskite may be a composition of manganite ($Pr_{0.7}Ca_{0.3}MnO_3$, $Pr_{0.5}Ca_{0.5}MnO_3$, other PCMO, LCMO, etc.), titanate (STO:Cr), zirconate (SZO:Cr, $Ca_2Nb_2O_7$:Cr, $Ta_2O_5$:Cr), etc. A filament may be formed inside the variable resistance element, where the filament serves as a current path of the cell current flowing through the resistive memory cell.

The compensation circuit 400 provides a compensation current Ib to a sensing node SN1. The compensation circuit 400 supplies the compensation current Ib to the sensing node SN1 to compensate for a level decrease of the sensing node SN1 that occurs by a cell current Ic flowing through the selected resistive memory cell 420.

As shown in FIG. 10, the compensation circuit 400 may include a reference transistor RT, a voltage source 220, the noise filtering circuit 100, and a copy transistor CT1.

A source terminal of the reference transistor RT may be connected to the power supply voltage VDD, and a gate terminal of the reference transistor RT may be connected to the voltage source 220 and the input terminal IN. With this configuration, the bias voltage generated by the bias voltage generating circuit 200-2 may be transferred to the noise filtering circuit 100.

The noise filtering circuit 100 may filter the bias voltage generated by the bias voltage generating circuit 200-2 and transfer it to the copy transistor CT1 through the output terminal OUT. A source terminal of the copy transistor CT1 is connected to the power supply voltage VDD and may generate the compensation current Ib. The compensation current Ib thus generated may be provided to a transistor MN1. The compensation circuit 400 may be configured in the form of a current mirror.

The clamping circuit 410 receives a clamping bias VCMP(t). The clamping bias VCMP(t) may change over time during a read period. The shape of the clamping bias VCMP(t) may be various. For example, the clamping bias VCMP(t) may increase over time. Alternatively, the clamping bias VCMP(t) may increase stepwise over time, or may increase over time in the form of a k-th order function (here, k is a natural number).

A sense amplifier OP1 is connected to the gate terminal of the transistor MN1 and may control the transistor MN1 on the basis of the clamping bias VCMP(t) and the cell current Ic. The sense amplifier OP1 may be a current sense amplifier or a voltage sense amplifier.

In concluding the detailed description, those skilled in the art will appreciate that many variations and modifications may be made to the exemplary embodiments above without departing from the scope of the present inventive concept. Therefore, the disclosed exemplary embodiments of the inventive concept are used in a generic and descriptive sense only and not for purposes of limitation.

What is claimed is:

1. A noise filtering circuit comprising:
   a first amplifier configured to receive a bias voltage at a first input terminal, receive a bias output voltage through a feedback path at a second input terminal, and compensate for a difference between the bias voltage and the bias output voltage;
   a first transistor connected to an output of the first amplifier and having a gate terminal to which an off-voltage is applied;
   a first capacitor connected to the first transistor;
   a second capacitor connected to the output of the first amplifier;
   a second transistor connected to the second capacitor and having a gate terminal to which an off-voltage is applied; and
   a second amplifier having a first input terminal connected to the first capacitor and a second input terminal connected to the second transistor.

2. The noise filtering circuit of claim 1, wherein a voltage gain of the first amplifier differs from a voltage gain of the second amplifier.

3. The noise filtering circuit of claim 2, wherein the voltage gain of the second amplifier is lower than the voltage gain of the first amplifier.

4. The noise filtering circuit of claim 3, wherein the voltage gain of the second amplifier is 1.

5. The noise filtering circuit of claim 1, wherein the second amplifier provides the bias output voltage of the output terminal to the second transistor, and does not provide the output of the second transistor to the output terminal.

6. The noise filtering circuit of claim 1, wherein first transistor and the second transistor are each a PMOS transistor.

7. The noise filtering circuit of claim 1, wherein a base region and a source region of the second transistor are connected to each other.

8. The noise filtering circuit of claim 7, wherein the second transistor includes a first conductive type substrate, and a well diode formed by a second conductive type well in which the base region and the source region are disposed.

9. The noise filtering circuit of claim 8, wherein second amplifier compensates for a leakage current of the well diode of the second transistor.

10. An electronic device comprising:
    a bias voltage generating circuit configured to generate a bias voltage;
    a noise filtering circuit configured to filter noise of the bias voltage to generate a bias output voltage; and
    an output circuit configured to perform a predetermined function using the bias output voltage,
    wherein the noise filtering circuit includes:
    a first amplifier configured to compensate for a difference between the bias voltage and the bias output voltage;
    a first transistor connected to an output of the first amplifier and having a gate terminal to which an off-voltage is applied;
    a first capacitor connected to the first transistor;
    a second capacitor connected to an output of the first amplifier;
    a second transistor connected to the second capacitor and having a gate terminal to which the off-voltage is applied; and a second amplifier configured to receive the bias output voltage and provide an output to the second transistor on the basis of the bias output voltage.

11. The electronic device of claim 10, wherein the electronic device is an analog to digital (A/D) converter, and the output circuitry comprises a signal generating circuit configured to generate an analog signal corresponding to a digital signal, using the bias output voltage.

12. The electronic device of claim 11, wherein the bias output voltage is provided to a first input terminal of the second amplifier, and a second input terminal of the second amplifier is connected to a source terminal of the second transistor and an output terminal of the second amplifier.

13. The electronic device of claim 12, wherein a source terminal of the first transistor is connected to an output terminal of the first amplifier, and a drain terminal of the first transistor is connected to the first capacitor.

14. The electronic device of claim 11, wherein the first amplifier compensates for a leakage current of a well diode included in the first transistor, and
the second amplifier compensates for the leakage current of the well diode included in the second transistor.

15. The electronic device of claim 11, wherein the second amplifier is a unity feedback amplifier.

16. The electronic device of claim 10, wherein,
the electronic device is a low dropout (LDO) regulator; and
the output circuit comprises a third amplifier that receives the output bias voltage at an input terminal thereof, a regulating transistor connected to an output of the third amplifier,
and at least one resistor coupled between the regulating transistor and a circuit ground.

17. The electronic device of claim 10, wherein the electronic device is a memory device comprising a compensation circuit, a memory cell, and a clamping circuit coupled between the compensation circuit and the memory cell.

18. A noise filtering circuit comprising:
a first amplifier configured to receive a bias voltage at a first input terminal, receive a bias output voltage, appearing at an output node of the noise filtering circuit, at a second input terminal through a feedback path, and compensate for a difference between the bias voltage and the bias output voltage;
a first transistor having an first end connected to an output of the first amplifier, a gate to which a voltage is applied sufficient to cause the first transistor to operate in a resistor mode, and a second end connected to the output node;
a first capacitor connected between the output node and a circuit ground;
a second transistor having a gate terminal to which a voltage is applied sufficient to operate the second transistor in a resistor mode;
a second capacitor connected between the output of the first amplifier and a first end of the second transistor; and
a second amplifier having an input terminal connected to the output node and an output terminal connected to a second end of the second transistor,
wherein the first capacitor and a resistance provided by the first transistor form a low pass circuit to filter noise.

19. The noise filtering circuit of claim 18, wherein the input terminal of the second amplifier is a first input terminal, and the second amplifier has a second input terminal connected to its output terminal such that the second amplifier operates as a unity gain amplifier.

20. The noise filtering circuit of claim 19, wherein each of the first and second transistors is a PMOS transistor, the first end of the first transistor is a source terminal, and the second end of the first transistor is a drain terminal, and the first and second ends of the second transistor are drain and source terminals, respectively.

* * * * *